United States Patent
Kamimura et al.

(10) Patent No.: US 8,420,555 B2
(45) Date of Patent: Apr. 16, 2013

(54) MANUFACTURING METHOD FOR SEMICONDUCTOR DEVICE AND MANUFACTURING APPARATUS FOR SEMICONDUCTOR DEVICE

(75) Inventors: Masaki Kamimura, Oita-ken (JP); Kenichi Yoshino, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 69 days.

(21) Appl. No.: 12/929,364

(22) Filed: Jan. 19, 2011

(65) Prior Publication Data
US 2011/0117512 A1 May 19, 2011

Related U.S. Application Data

(62) Division of application No. 12/490,753, filed on Jun. 24, 2009, now Pat. No. 7,897,524.

(30) Foreign Application Priority Data

Jun. 24, 2008 (JP) ................................. 2008-164692

(51) Int. Cl.
- F27D 19/00 (2006.01)
- F27D 21/00 (2006.01)
- A01H 5/02 (2006.01)
- C21D 9/00 (2006.01)
- H01L 21/00 (2006.01)

(52) U.S. Cl.
USPC ............... 438/795; 432/32; 432/93; 432/261; 414/936

(58) Field of Classification Search .................. 257/200, 257/369, 314, E27.062, E27.05, E21.529; 438/118, 108, 14, 795, 617; 432/32, 239, 432/31, 53, 93, 261; 414/936
See application file for complete search history.

(56) References Cited

U.S. PATENT DOCUMENTS

| | | | |
|---|---|---|---|
| 4,804,633 A * | 2/1989 | Macelwee et al. | 438/16 |
| 5,445,675 A | 8/1995 | Kubodera et al. | |
| 5,830,277 A * | 11/1998 | Johnsgard et al. | 118/725 |
| 6,849,831 B2 | 2/2005 | Timans et al. | |
| 7,283,734 B2 | 10/2007 | Kubo | |
| 2002/0052174 A1* | 5/2002 | Nishimura et al. | 451/54 |
| 2003/0053893 A1* | 3/2003 | Matsunaga et al. | 414/217 |
| 2003/0166313 A1 | 9/2003 | Nishikawa et al. | |
| 2003/0205664 A1* | 11/2003 | Abe et al. | 250/214 R |
| 2004/0108519 A1 | 6/2004 | Itani | |
| 2004/0168632 A1* | 9/2004 | Ito et al. | 118/715 |
| 2007/0224839 A1* | 9/2007 | Shimizu | 438/795 |
| 2007/0292598 A1 | 12/2007 | Tada et al. | |
| 2009/0031954 A1* | 2/2009 | Nishikido et al. | 118/725 |
| 2009/0214786 A1* | 8/2009 | Chang et al. | 427/255.392 |
| 2009/0274454 A1 | 11/2009 | Aderhold et al. | |
| 2009/0298300 A1 | 12/2009 | Ranish et al. | |

FOREIGN PATENT DOCUMENTS

| | | |
|---|---|---|
| JP | 2003-051439 | 2/2003 |
| JP | 2007-095889 | 4/2007 |

* cited by examiner

Primary Examiner — Matthew Smith
Assistant Examiner — Wilner Jean Baptiste
(74) Attorney, Agent, or Firm — Finnegan, Henderson, Farabow, Garrett & Dunner, L.L.P.

(57) ABSTRACT

A manufacturing method for a semiconductor device including: determining pattern dependency of a radiation factor of an element forming surface of one wafer having a predetermined pattern formed on the wafer; determining a heating surface of the wafer, based on the pattern dependency of the radiation factor; holding the one wafer having the determined heating surface and another wafer having a determined heating surface, spaced at a predetermined distance in such a manner that non-heating surfaces of the one wafer and the another wafer oppose to each other; and heating the each heating surface of the one wafer and the another wafer.

9 Claims, 4 Drawing Sheets

MANUFACTURING METHOD FOR SEMICONDUCTOR DEVICE AND MANUFACTURING APPARATUS FOR SEMICONDUCTOR DEVICE

CROSS-REFERENCE TO RELATED APPLICATION

This is a division of application Ser. No. 12/490,753, filed Jun. 24, 2009 now U.S. Pat. No. 7,897,524, which is incorporated herein by reference.

This application is based upon and claims the benefit of priority from the prior Japanese Patent Application No. 2008-164692 filed on Jun. 24, 2008, the entire contents of which are incorporated herein by reference.

BACKGROUND OF THE INVENTION

The present invention relates to a manufacturing method for a semiconductor device and a manufacturing apparatus for a semiconductor device, for example, used for activation anneal of a semiconductor wafer.

To improve a current driving force of a transistor with the recent tendency of high integration and high performance of a semiconductor device, spike RTA (Rapid Thermal Annealing) is used in an anneal process for forming a source-drain diffusion layer. According to the spike RTA, a wafer is irradiated with the light of high energy using, for example, a halogen lamp as a heat source to rapidly raise or lower the temperature of the wafer to reach approximately 1,000° C. Hence, impurities can be prevented from diffusing in a depth direction to ensure ion activation.

On the other hand, a wafer in-plane radiation factor of a wafer heated by the spike RTA may significantly vary due to, for example, formation of a pattern having a different multi layered film structure or shape on the wafer. In a region having a low radiation factor, a sufficient amount of light energy cannot be absorbed while a wafer is being annealed. For example, even when a wafer needs to reach a temperature of 1,000° C. for activation, a temperature may reach no more than approximately 900° C. and hence cannot reach a required temperature for activation of impurities. As a result, impurities are not sufficiently activated and a resistance difference is generated within the wafer surface, thus causing a disadvantage such as degradation in transistor performance.

Japanese Patent Application Laid-Open No. 2007-95889 (e.g., claim 1, paragraph [00421]), for example, discloses a method for heating an object to be treated having variable radiation factor distribution to obtain a uniform distribution. However, a control system for controlling a heating temperature in a wafer surface becomes complicated, which causes a disadvantage of difficulty in close temperature control.

SUMMARY

According to an aspect of the present invention, there is provided a manufacturing method for semiconductor device comprising: determining pattern dependency of a radiation factor of an element forming surface of one wafer having a predetermined pattern formed on the wafer; determining a heating surface of the wafer, based on the pattern dependency of the radiation factor; holding the one wafer having the determined heating surface and another wafer having a determined heating surface, spaced at a predetermined distance in such a manner that non-heating surfaces of the one wafer and the another wafer oppose to each other; and heating the each heating surface of the one wafer and the another wafer.

According to an aspect of the present invention, there is provided a manufacturing apparatus for semiconductor device comprising: a transfer mechanism configured to hold and transferring a wafer having a predetermined pattern on an element forming surface of the wafer; a wafer rotating mechanism configured to rotate the wafer around an axis of a face direction of the wafer; a wafer holder configured to hold the wafer; and a heating mechanism configured to heat, being spaced from the wafer

DETAILED DESCRIPTION

Figure 1:
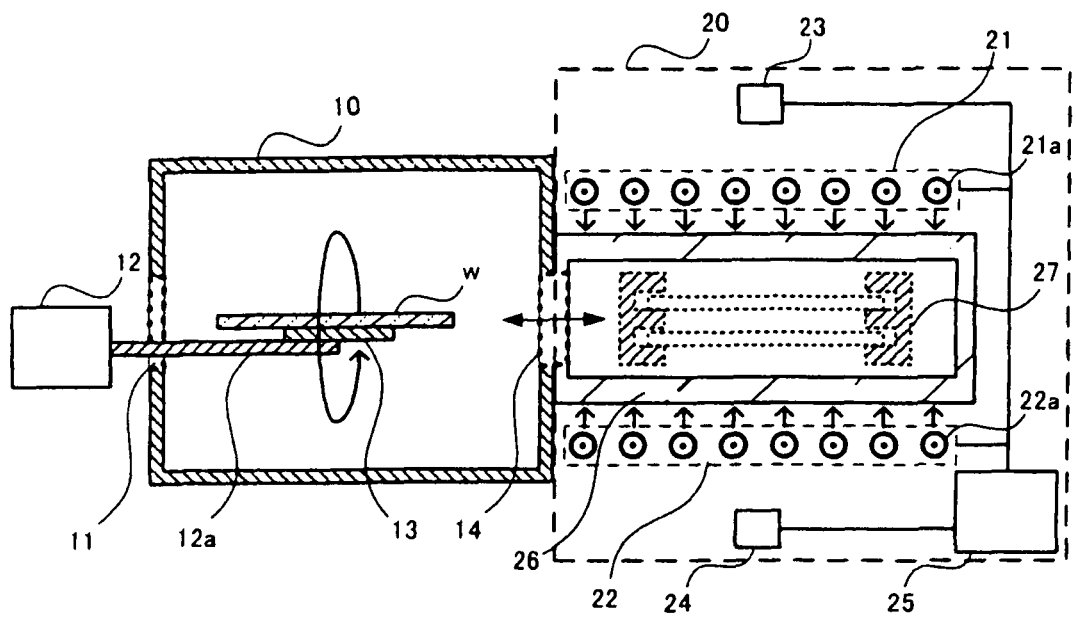
FIG. 1 is a sectional view of a manufacturing apparatus for a semiconductor device according to an aspect of the present invention.

Reference will now be made in detail to the present embodiment of the invention, an example of which is illustrated in the accompanying drawings. Wherever possible, the same reference numbers will be used throughout the drawing to refer to the same or like parts.

First Embodiment

FIG. 1 is a sectional view of a manufacturing apparatus for a semiconductor device according to the present embodiment. As illustrated in FIG. 1, the manufacturing apparatus for a semiconductor device includes a transfer unit 10 for rotating and transferring a wafer w (w') and a heating unit 20 for annealing wafers w, w'.

The transfer unit 10 is provided with a transfer drive mechanism 12 having a transfer mechanism for transferring a wafer w (w') loaded in through a gate 11 to the heating unit 20 and a rotating mechanism for performing rotation around an axis of a face direction of the wafer. To the transfer drive mechanism 12, there is connected, through a transfer drive portion 12a, a wafer holding portion 13 having a vacuum chuck or an electrostatic chuck or the like for holding the wafer w or w'.

The heating unit 20, which is connected with such a transfer unit 10 through a gate 14, into which wafers w, w' are transferred, and which heats the wafers, includes a pair of heating mechanisms 21, 22. The heating mechanisms 21, 22 have, for example, a plurality of halogen lamps 21a, 22a as a radiation light source and can heat two wafers w, w' at a heating rate of 100 to 250° C./sec up to 800 to 1,150° C., respectively.

Above the upper heating mechanism 21 and below the lower heating mechanism 22, there are provided radiation thermometers 23, 24 for measuring temperatures of wafers w, w', respectively. The radiation thermometers 23, 24 are connected to a temperature control mechanism 25 which is connected to the heating mechanisms 21, 22.

The temperature control mechanism 25 adjusts outputs of the halogen lamps 21a, 22a in real time, based on the temperatures of the wafer w, w' measured by the radiation thermometers 23, 24. A chamber 26, made of a material such as quartz for annealing the wafers w, w' is provided in such a manner as to be sandwiched by the heating mechanisms 21, 22.

Figure 2A:
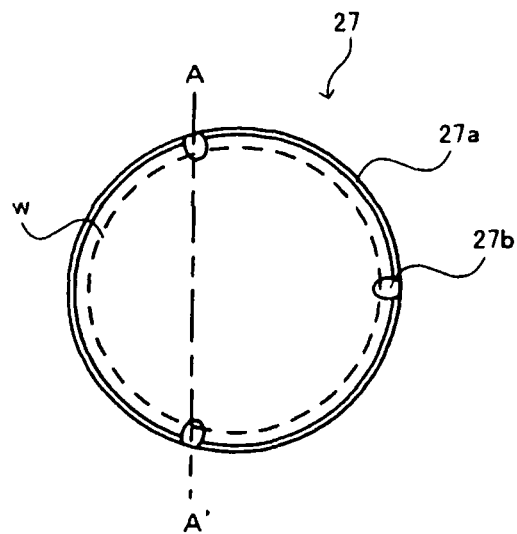
FIG. 2A illustrates a wafer holder according to an aspect of the present invention.
Figure 2B:
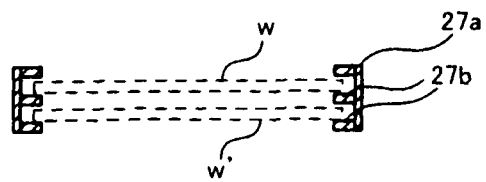
FIG. 2B is a sectional view taken along line A-A' of FIG. 2A.

The chamber 26 can be purged, using an inert gas or the like. Inside the chamber 26, there is attached a wafer holder 27 for holding two wafers w, w', spaced from each other at a predetermined distance. The wafer holder 27, as illustrated in FIG. 2A and FIG. 2B illustrating a sectional view taken along A-A' of FIG. 2A, includes a donut-shaped outer-peripheral portion 27a and a placement portion 27b. The placement portion 27b is connected to the outer-peripheral portion 27a and holds two wafers w, w' at a peripheral portion thereof, respectively. For example, three placement portions 27b are provided to hold wafers w, w' in such a manner that the placement portions 27b are in contact with the wafers w, w' within a region of 3 mm or less from outermost peripheries of the wafers.

Using a manufacturing apparatus for a semiconductor device structured in this way, ion-implanted wafers w, w' are heated as described below.

First, a wafer w is loaded into the manufacturing apparatus. At this time, a heating surface of the wafer is determined in advance. Accordingly, when an element forming surface (hereinafter referred to as a "front face") has a pattern as a result of formation of a gate electrode portion, element-separation region or the like, it is first determined whether pattern dependency of a radiation factor is high.

For example, it can be determined based on a past history before heating that pattern dependency is high when an area of a predetermined film type in a pattern on a wafer front face exceeds a predetermined value or when a covering rate (total area) of a predetermined film type (structure) on a wafer front face exceeds a predetermined value. When the pattern dependency of the radiation factor of a wafer front face is high, a heating surface of a wafer w is a non-element-forming surface (hereinafter referred to as a "rear face") while, when the pattern dependency is low, the heating surface is the "front face".

The following description will be made on a case where the pattern dependency of the radiation factor of a wafer front face is high and a heating surface is the rear face.

A wafer w having a rear face as a heating surface is placed on a wafer holding portion 13 with a front face directed upward and is held by chucking the rear face. The held wafer w is loaded into the transfer unit 10 by the transfer drive portion 12a. The loaded-in wafer w is rotated and inverted around an axis of a face direction of the wafer was by the transfer drive portion 12a in such a way that the rear face as a heating surface is directed upward.

The inverted wafer w is transferred through the gate 14 into the chamber 26 in the heating unit 20 by the transfer drive portion 12a in such a state that the wafer w is held at the rear face (upward) by the wafer holding portion 13. The transferred wafer w is placed on an upper stage of the placement portion 27b of the wafer holder 27.

Similarly, the wafer w' whose heating surface is determined as the rear face is placed on the wafer holder 13 with a front face directed upward and is held by chucking the rear face in the same way as the wafer w. The held wafer w' is loaded into the transfer unit 10 by the wafer transfer drive portion 12a.

Similarly, the loaded-in wafer w' is transferred through the gate 14 into the chamber 26 in the heating unit 20 by the transfer drive portion 12a in such a state that the wafer w' is held at the rear face (downward) by the wafer holding portion 13 without being inverted. Next, the wafer w' is placed on a lower stage of the placement portion 27b of the wafer holder 27.

After the gate 14 is closed, the wafers w, w' held by the wafer holder 27 such that non-heating surfaces (front faces) thereof oppose to each other are heated with a predetermined gas such as $N_2$ purged from the chamber 26.

In this heating process, after each of front face temperatures of the wafers w, w' is heated by the heating mechanisms 21, 22 through the chamber 26 made of quartz, for example, at a heating rate of 100 to 250° C./sec. up to 1,000° C. and held for 1 to 2 sec., the temperatures of the wafers are lowered, respectively. In this process, the temperature control mechanism 25 adjusts outputs of the halogen lamps 21a, 22a in real time, based on temperatures of the rear faces of the wafers w, w' measured by the radiation thermometers 23, 24.

After completion of heating the wafers w, w', the gate 14 is opened. First, the lower wafer w' is unloaded from the chamber 26 using the transfer drive portion 12a, and unloaded from the apparatus through the transfer unit 10. Then, the upper wafer w is unloaded from the chamber 26 using the transfer drive portion 12a. The wafer w, after the front face thereof is inverted to be directed upward in the transfer unit 10, is unloaded from the apparatus.

Figure 3:
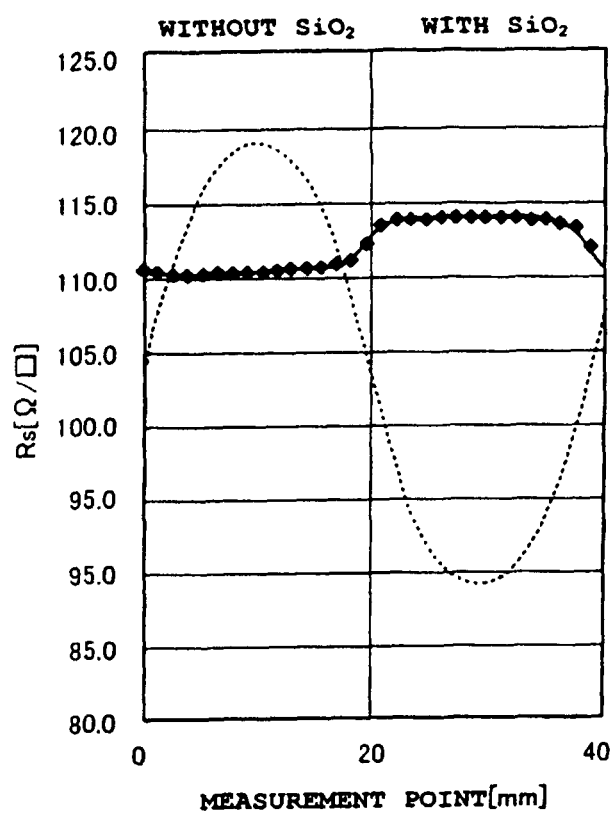
FIG. 3 illustrates measurement results of a sheet resistance at an in-plane position of a wafer according to an aspect of the present invention.

FIG. 3 illustrates a measurement result of a sheet resistance at a wafer in-plane position according to the four terminal method on the wafer heated from the rear face.

$BF_2$ ions are previously ion-implanted into the wafer under conditions of the acceleration energy of 40 KeV, the dosage of $5.00 \times 10^{15}/cm^2$ and a surface reach temperature in a heating process of 1,080° C. On a part of the front face of the wafer, a region where 400 nm thick $SiO_2$ film having high radiation factor is covered by 20 mm in width is formed as a region having high pattern dependency of the radiation factor.

FIG. 3 also illustrates results of sheet resistance measurements made in the same way on a conventional wafer heated from a front face as a comparative example.

In the comparative example, a front face temperature is raised by radiation heat in the $SiO_2$-covered region and hence a difference in the sheet resistance from a non-covered region caused by the resulting low resistance value becomes approximately 30 Ω/sq. In contrast, according to the present embodiment, radiation amount in the $SiO_2$-covered region becomes larger. Therefore, although the front face temperature lowers and the resistance value becomes a little higher, the sheet resistance difference can be reduced to approximately 3 Ω/sq. or approximately ⅒ times as large as a conventional one.

The pattern dependency of the radiation factor is determined in this way and the wafers w, w' having the dependency determined to be high are heated from the rear face, respectively. By heating the wafers from the rear face in this way, uniform heating can be performed without depending upon variations in the radiation factor of the front face of a wafer. By holding and heating the two wafers, facing each other, heating can be performed with a high thermal efficiency by the radiation heat from each of the wafers facing each other even by heating from the rear face. In addition, since the two wafers can be heated at the same time, processing efficiency can be further improved.

In the present embodiment, the pattern dependency of the radiation factor is determined based on a past history. However, the present invention is not particularly limited thereto, and may use any method for determining the pattern dependency of the radiation factor in advance.

For example, the pattern dependency may be determined in advance based on the radiation factor obtained from the reflectance and transmittance measured by irradiating the wafer with predetermined reference light.

Further, for example, the presence/absence of a pattern and a shape of the pattern corresponding to a position of a wafer front face may be detected, using a solid-state imaging device such as CCD (Charge Coupled Device) or CMOS (Complementary Metal Oxide Semiconductor) sensor and may be compared to a previously stored pattern having high pattern dependency of a radiation factor. When the correlation coefficient thereof exceeds a predetermined value, the pattern dependency can be determined to be high.

In the present embodiment, the wafers w, w' are held at, for example, three positions on the outermost periphery thereof by the wafer holder 27, but the method for holding a wafer is not particularly limited thereto.

Figure 4A:
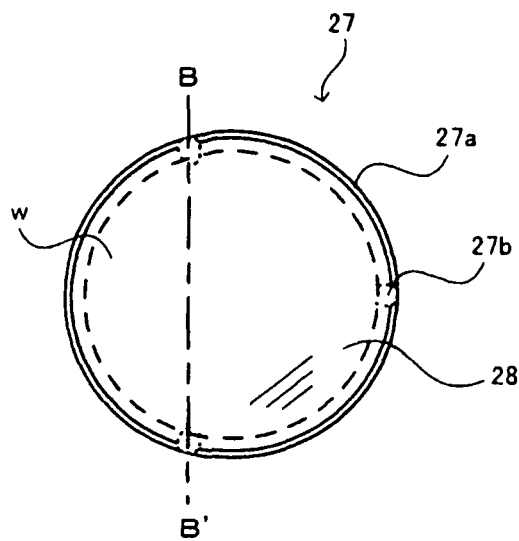
FIG. 4A illustrates a holder for heat transfer on a rear face according to an aspect of the present invention.
Figure 4B:
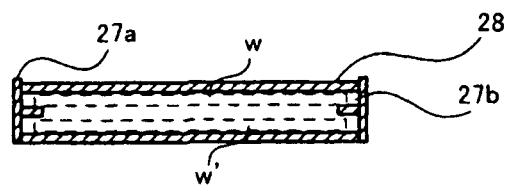
FIG. 4B is a sectional view taken along line B-B' of FIG. 4A.

For example, as illustrated in FIG. 4A and FIG. 4B, a sectional view taken along line B-B' of FIG. 4A, a holder 28 for heat transfer on a rear face may be provided to be in contact with the rear faces of the wafers w, w'. On the rear face of a wafer, a protective film such as an oxide film is formed. However, the protective film is not particularly formed by strictly controlling the conditions. Therefore, the radiation factor varies depending on a film thickness or film constitution of the rear face. Accordingly, the holder 28 for heat transfer on a rear face is provided. By performing heating through the holder 28, heating amount (reach temperature) relative to an element region of a wafer front face can be made constant regardless of variations in the radiation factor.

Preferably, the holder 28 for heat transfer on a rear face is constructed from a material which has a thickness large enough to keep a temperature constant even during high speed temperature rising and which does not make the wafers w, w' exposed to metal contamination. For example, there may be used a material formed by covering a silicon plate with silicon carbide apt to absorb radiation light, silicon nitride film or silicon oxide film. Specifically, there can be used a material formed by covering a 0.75 mm thick silicon plate with silicon nitride film having a film thickness of 150 nm.

Second Embodiment

Figure 5:
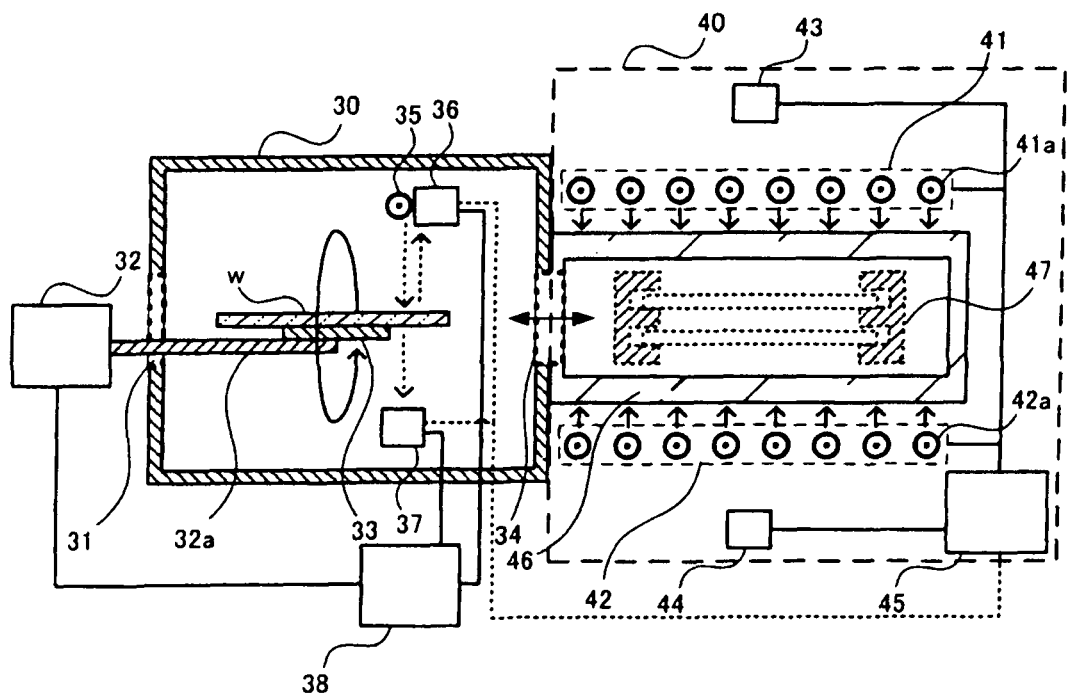
FIG. 5 is a sectional view of a manufacturing apparatus for a semiconductor device according to another aspect of the present invention.

FIG. 5 is a sectional view of a manufacturing apparatus for a semiconductor device according to the present embodiment. The present embodiment is includes a transfer unit 30 for rotating and transferring a wafer w and a heating unit 40 for annealing a wafer w in the same way as First Embodiment. However a difference from First Embodiment lies in that a measurement function for determining pattern dependency of a radiation factor of a wafer is mounted in the transfer unit 30.

The transfer unit 30 includes a transfer mechanism for transferring a loaded wafer w to the heating unit 40 and a transfer drive mechanism 32 having a rotating mechanism for rotating around an axis of a face direction of a wafer. To the transfer drive mechanism 32, there is connected a wafer holding portion 33 having a vacuum chuck or an electrostatic chuck for holding a wafer w through a transfer drive portion 32a.

Above the transfer unit 30, there are provided a reference light source 35 for irradiating a wafer w with reference light and a reflectance measuring instrument 36 for detecting reflected light thereof and measuring reflectance. On the other hand, below the transfer unit 30, a transmittance measuring instrument 37 for detecting transmitted light and measuring transmittance. The position of the reference light source 35 is not limited to above the transfer unit 30, but may be below the transfer unit 30 or at the side thereof. In this case, the reflectance measuring instrument 36 is mounted in such a direction that the transmittance measuring instrument 37 faces in the same direction.

A radiation factor distribution detection mechanism is constructed from the reference light source 35, the reflectance measuring instrument 36, the transmittance measuring instrument 37 and the transfer drive mechanism 32. These components are connected with a heating surface determination mechanism 38 for determining a heating surface.

The heating unit 40, which is connected with such a transfer unit 30 through a gate 34 to transfer wafers w, w' and which heats the wafers, has a pair of heating mechanisms 41, 42 in the same way as First Embodiment. The heating mechanisms 41, 42 have, for example, a plurality of halogen lamps 41a, 42a as a radiation light source and can heat two wafers w, w' at a heating rate of 100 to 250° C./sec. up to 800 to 1,150° C.

Under the upper and lower heating mechanisms 42 of the upper heating mechanism 41, there are provided radiation thermometers 43, 44 for measuring wafers w, w', respectively, in the same way as First Embodiment. The radiation thermometers 43, 44 are connected with a temperature control mechanism 45 connected with the heating mechanisms 41, 42.

The temperature control mechanism 45 adjusts outputs of the halogen lamps 41a, 42a in real time, based on temperatures of the wafer w, w' measured by the radiation thermometers 43, 44, in the same way as First Embodiment. The temperature control mechanism 45 is further connected directly or through the heating surface determination mechanism 38, with the reflectance measuring instrument and the transmittance measuring instrument 37, to perform control based on measurement results of reflectance and transmittance, as needed.

A chamber 46, made of a material such as quartz for annealing the wafers w, w' is provided in such a manner as to be sandwiched by the heating mechanisms 41, 42. Inside the chamber 46, there is attached a wafer holder 47 for holding two wafers w, w', spaced from each other at a predetermined distance, in the same way as for First Embodiment.

Using such a manufacturing apparatus for a semiconductor device, an ion-implanted wafer w is heated as described below.

First, the wafer w is placed on the wafer holder 33 with a front face directed upward and is held by chucking the rear face. The held wafer w is loaded into the transfer unit 30 by the transfer drive portion 32a.

A measuring point on a front face of the loaded wafer w is irradiated with reference light by the reference light source 35. The reflectance measuring instrument 36 measures a reflectance, while the transmittance measuring instrument 37 measures transmittance. Next, transfer drive portion 32a moves the wafer was needed and, at a plurality of measuring points, reflectance and transmittance are measured.

Based on the measured reflectance, transmittance and positional information from the transfer drive mechanism, a radiation factor distribution of a front face of a wafer w is determined. When variations exceed a predetermined value, the heating surface determination mechanism 38 determines the pattern dependency of a radiation factor to be high. When the pattern dependency of the radiation factor of the wafer front face is high, a heating surface of a wafer w is the rear face, while when the pattern dependency is low, a heating surface is the front face.

The following description will be made on a case when the pattern dependency of the radiation factor of a wafer front face is high and a heating surface is the rear face thereof.

A wafer w having a heating surface as the rear face is rotated around an axis of a face direction of the wafer and inverted such that the rear face is directed upward by the transfer drive portion 32a. With the wafer held at the rear face (upward) by the wafer holding portion 33, the reflectance and transmittance are measured at a plurality of measurement points on the rear face of the wafer w in the same way as for the front face of the wafer w.

The wafer w in which the reflectance and transmittance of the rear face thereof have been measured is transferred into a chamber 46 in the heating unit 40, passing through a gate 34 by a transfer drive portion 32a with the wafer held at the rear face (upward) by a wafer holding portion 33. Subsequently, the wafer is placed on the upper stage of a wafer holder 47.

At a plurality of measurement points on the rear face of the wafer w' having a heating surface determined to be a rear face, the reflectance and transmittance are measured. Next, the wafer w' is inverted again, held at the rear face (downward) by the wafer holding portion 33, passing through the gate 34 with the transfer drive portion 32a and is loaded into the chamber 46 in the heating unit 40. Subsequently, the wafer is placed on the lower stage of the wafer holder 47.

The wafers w, w' held such that non-heating surfaces (front faces) oppose to each other with the wafer holder 47 are heated, after the gate 34 is closed and a predetermined gas such as $N_2$ is purged from the chamber 46, in the same way as for First Embodiment.

In this heating process, the heating mechanisms 41, 42 heats the wafers w, w' at a heating rate of 100 to 250° C./sec. until surface temperatures thereof reach, for example, 1,000° C. through a chamber 46 made of quartz and, under such a condition, the surface temperatures are held for 1 to 2 seconds and then the wafer temperatures are lowered, respectively.

At this time, based on a radiation factor obtained from a reflectance and a transmittance of the wafers w, w' measured by the radiation thermometers 43, 44 at each of the wafers w, w', a preset temperature is adjusted and further based on a temperature of a rear face, the temperature control mechanism 45 adjusts outputs of the halogen lamps 41a, 42a in real time in the same way as for First Embodiment.

After completion of heating the wafers w, w', the gate 34 is opened. First, the lower wafer w' is unloaded from the chamber 46, using the transfer drive portion 32a and is unloaded through the transfer unit 30. Next, the upper wafer w is unloaded from the chamber 46, using the transfer drive portion 32a. The wafer w, after the front face thereof is inverted to be directed upward in the transfer unit 30, is unloaded from the outside of the apparatus.

Hence, the wafers w, w' heated from the rear face, respectively, can be uniformly heated without depending upon variations in front face radiation factor within a wafer plane, in the same way as First Embodiment. In addition, by holding and heating the two wafers facing each other, heating can be performed with high thermal efficiency by radiation heat from the wafers facing each other. Further, since the two wafers can be heated at the same time, processing efficiency can be further improved.

On the rear face of the wafer, a protective film such as an oxide film is formed as described above. However, the protective film is not particularly formed by strictly controlling the conditions and therefore the radiation factor varies depending on a film thickness or film constitution of the rear face. Accordingly, by changing, as needed, conditions (recipe) of wafer rear face heating based on a radiation factor of the wafer rear face as proposed in the present embodiment, heating amount for an element region of the wafer front face can be set to be constant.

It is sufficient if measurement of the reflectance of the wafer rear face is made as needed. For example, by providing a holder for rear face heat transfer for obtaining a wafer thickness which allows a temperature to be sufficiently constant even in a temperature rising state at a high speed, in such a manner that the holder is in contact with the rear faces of the wafers w, w', the heating amount (reach temperature) for an element region in the wafer front face as described above can be set to be constant without depending upon a film thickness and film configuration of the rear face.

In the present embodiment, reference light is not particularly defined, but, for example, a reflectance and a transmittance of a particular wavelength in a visible region or an infrared region may be measured. In addition, using a plurality of wavelengths for reference light, a reflectance, transmittance, reflectance spectrum or transmittance spectrum thereof may be measured.

In the present embodiment, the pattern dependency of a radiation factor is determined from reflectance and a heating surface is determined, but a method for determining the pattern dependency of the radiation factor is not limited thereto. For example, when a pattern detecting mechanism using a solid-state imaging device such as CCD or CMOS sensor is disposed in a transfer unit in place of a reflectance measuring instrument, the presence/absence and the shape of a pattern corresponding to a position of a wafer front face are detected. By comparing the detected pattern to a previously stored pattern having high pattern dependency of a radiation factor, the pattern dependency may be determined to be high when a correlation coefficient thereof exceeds a predetermined value.

Figure 6:
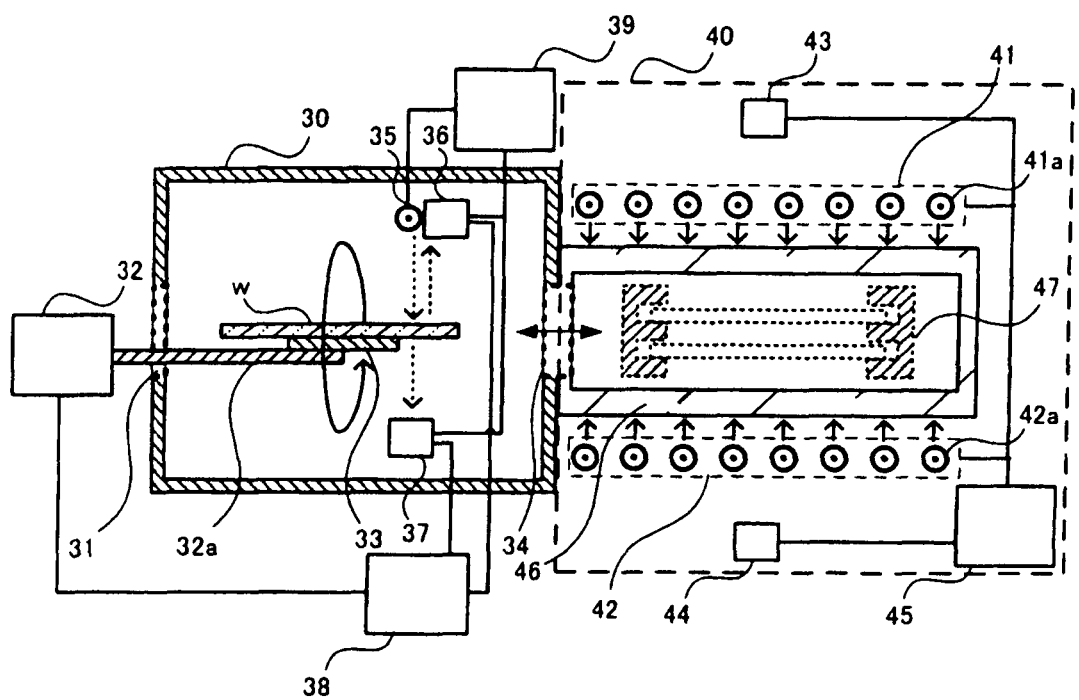
FIG. 6 is a sectional view of a manufacturing apparatus for a semiconductor device according to another aspect of the present invention.

In the present embodiment, the wafers w, w' are moved by the transfer drive portion 32a to measure a reflectance. As illustrated in FIG. 6, however, the measurement may be performed by fixing the wafers w, w' and moving the reference light source 35, a reflectance measuring instrument 36 and the transmittance measuring instrument 37 by a drive mechanism 39 provided on the side thereof. Such a drive mechanism may be mounted on the pattern detecting mechanism using the solid-state imaging device described above in the same way.

In these embodiments, an example of heating from the rear face of the wafer is described above, but the heating surface is not limited to only the rear face. For a wafer having low pattern dependency of a radiation factor, heating may be performed from the front face. In this case, the wafer placed on a lower stage of the wafer holder is inverted such that the front face is directed downward.

Two wafers are processed at the same time, using the manufacturing apparatus for a semiconductor device in these embodiments, but the two wafers are not always required to be processed and therefore only one wafer may be processed. At this time, preferably, a dummy wafer may be used to face a wafer to be processed. In the case of processing only one wafer, a heating unit does not always require such an opposing manner as described in the present embodiment. For example, a heater may be mounted upward or downward and the wafer may inverted by the transfer drive portion as needed such that a determined heating surface opposes to the heater and placed on the wafer holder for heating.

In these embodiments, a case where annealing is performed for activation of impurities was exemplified, but the present invention is not limited thereto. The present invention is applicable to a case where heating treatment using radiation light is performed. The present invention is also applicable to a case where a process placed under a lower temperature or a condition of a low temperature-rise rate, such as salicide formation process.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A manufacturing apparatus for a semiconductor device for performing heat treatment of a wafer having a front surface where a predetermined pattern is formed and a rear surface where no pattern is formed, the apparatus comprising:
    a transfer unit configured to transfer the wafer;
    a heating unit configured to anneal the wafer;
    a transfer mechanism provided in the transfer unit and configured to hold and transfer the wafer;
    a wafer holder provided in the heating unit and configured to hold the wafer;
    a heating mechanism provided in the heating unit and configured to heat the wafer, the heating mechanism being spaced from the wafer;
    a heating surface determination mechanism configured to determine which one of the front surface or the rear surface of the wafer is to be used as a heating surface that faces the heating mechanism, based on the radiation factor distribution detected within the front surface of the wafer; and
    a wafer rotating mechanism configured to rotate the wafer around an axis parallel to the front surface of the wafer based on the heating surface determined by the heating surface determination mechanism,
    wherein the wafer rotating mechanism rotates the wafer so that the heating surface determined by the heating surface determination mechanism faces the heating mechanism.

2. The manufacturing apparatus for a semiconductor device according to claim 1, wherein the wafer holder is structured to hold two wafers spaced from each other at a predetermined distance.

3. The manufacturing apparatus for a semiconductor device according to claim 2, wherein the heating mechanism comprises first and second heating mechanisms which are provided on both sides of the wafer holder, the heating mechanisms facing each other.

4. The manufacturing apparatus for a semiconductor device according to claim 3, wherein the wafer holder holds a pair of the wafers in such a manner that the surfaces other than the heating surfaces of the wafers determined by the heating surface determination mechanism face each other, using the wafer rotating mechanism.

5. The manufacturing apparatus for a semiconductor device according to claim 1, wherein the wafer holder is a rear-face-heat-transfer type holder, which is in contact with the rear surface of the wafer where the predetermined pattern is not formed.

6. The manufacturing apparatus for a semiconductor device according to claim 1, further comprising:
    a radiation factor distribution detection mechanism configured to detect a radiation factor distribution within the front surface of the wafer;
    wherein the heating surface determination mechanism determines which one of the front surface or the rear surface of the wafer is to be used as a heating surface that faces the heating mechanism, based on the radiation factor distribution detected by the radiation factor distribution detection mechanism.

7. The manufacturing apparatus for a semiconductor device according to claim 6, wherein the radiation factor distribution detection mechanism includes: a reference light source for irradiating the wafer; a reflectance measuring instrument for detecting reflected light from the wafer; and a transmittance measuring instrument for detecting transmitted light transmitting through the wafer.

8. The manufacturing apparatus for a semiconductor device according to claim 7, wherein the radiation factor distribution detection mechanism includes a drive mechanism.

9. The manufacturing apparatus for a semiconductor device according to claim 6, wherein the radiation factor distribution detection mechanism is further configured to detect a radiation factor distribution within a rear surface of the wafer where the predetermined pattern detected is not formed,
    wherein the heating mechanism is controlled based on the radiation factor distribution within the rear surface detected by the radiation factor distribution detection mechanism.

* * * * *